(12) United States Patent
Solomon et al.

(10) Patent No.: US 9,154,095 B2
(45) Date of Patent: Oct. 6, 2015

(54) BOOST-ON-DEMAND AMPLIFIER

(71) Applicant: Bose Corporation, Framingham, MA (US)

(72) Inventors: Jay Solomon, Stow, MA (US); Valerie M. Mollo, Wilmington, MA (US); Elena Acosta Antonellis, Holliston, MA (US); Shiufun Cheung, Lexington, MA (US)

(73) Assignee: Bose Corporation, Framingham, MA (US)

( * ) Notice: Subject to any disclaimer, the term of this patent is extended or adjusted under 35 U.S.C. 154(b) by 267 days.

(21) Appl. No.: 13/832,837

(22) Filed: Mar. 15, 2013

(65) Prior Publication Data

US 2014/0270240 A1    Sep. 18, 2014

(51) Int. Cl.
| | |
|---|---|
| H03F 99/00 | (2009.01) |
| H03G 3/00 | (2006.01) |
| H03F 1/02 | (2006.01) |
| H03F 3/185 | (2006.01) |
| H03F 3/68 | (2006.01) |

(52) U.S. Cl.
CPC ............. H03G 3/007 (2013.01); H03F 1/025 (2013.01); H03F 3/185 (2013.01); H03F 3/68 (2013.01); *H03F 2200/321* (2013.01); *H03F 2200/511* (2013.01)

(58) Field of Classification Search
None
See application file for complete search history.

(56) References Cited

U.S. PATENT DOCUMENTS

| | | | |
|---|---|---|---|
| 5,161,097 A | | 11/1992 | Ikeda |
| 6,104,248 A | * | 8/2000 | Carver ..................... 330/297 |
| 6,191,567 B1 | | 2/2001 | Sluijs |
| 6,882,130 B2 | | 4/2005 | Handa et al. |
| 7,482,869 B2 | | 1/2009 | Wilson |
| 7,498,876 B2 | | 3/2009 | Peruzzi et al. |
| 7,969,133 B2 | | 6/2011 | Zhang et al. |
| 8,089,253 B2 | | 1/2012 | Murtojarvi |
| 8,198,941 B2 | | 6/2012 | Lesso |

(Continued)

FOREIGN PATENT DOCUMENTS

| | | |
|---|---|---|
| DE | 19858963 A1 | 7/2000 |
| EP | 0279694 | 8/1988 |

(Continued)

OTHER PUBLICATIONS

"LTC3787—Polyphase Synchronous Boost Controller" by Linear Technology, Apr. 27, 2012, 36 pages.
International Search Report and Written Opinion in related International Patent Application No. PCT/US14/64277, mailed on Mar. 9, 2015; 9 pages.
Non-Final Office Action in related U.S. Appl. No. 14/078,613, mailed on Aug. 3, 2015; 13 pages.

*Primary Examiner* — Thang Tran
(74) *Attorney, Agent, or Firm* — Schmeiser, Olsen & Watts LLP

(57) ABSTRACT

A method and an amplifier for amplifying audio signals receive and process an incoming audio sample in preparation for amplification by an electronic amplifier circuit. A boost supply circuit receives a voltage from a power supply. A processor system determines whether amplification of the incoming audio sample warrants more voltage than the voltage received from the power supply. Before completing the processing of the incoming audio sample, the processor system sends a signal to the boost supply circuit to boost the voltage received from the power supply and to supply the boosted voltage to the electronic amplifier circuit if the incoming audio sample warrants more voltage than the voltage received from the power supply. Otherwise, the boost supply circuit passes the voltage received from the power supply to the electronic amplifier circuit.

21 Claims, 4 Drawing Sheets

(56) References Cited

U.S. PATENT DOCUMENTS

| | | | |
|---|---|---|---|
| 2002/0153940 A1* | 10/2002 | Wurcer et al. | 327/536 |
| 2003/0107412 A1* | 6/2003 | Melsa | 327/108 |
| 2004/0125968 A1* | 7/2004 | Pearce et al. | 381/120 |
| 2008/0069385 A1 | 3/2008 | Revit | |
| 2009/8010014 | 5/2008 | Lipcsei | |
| 2008/0144861 A1* | 6/2008 | Melanson et al. | 381/120 |
| 2009/0231030 A1* | 9/2009 | Li et al. | 330/10 |
| 2010/0321116 A1* | 12/2010 | Kim et al. | 330/297 |
| 2012/0262232 A1* | 10/2012 | Sukegawa et al. | 330/127 |
| 2013/0057342 A1* | 3/2013 | Zhu | 330/127 |
| 2013/0077806 A1* | 3/2013 | Zhang et al. | 381/120 |
| 2013/0083947 A1 | 4/2013 | Moertel et al. | |
| 2013/0108081 A1* | 5/2013 | Ozaki et al. | 381/121 |

FOREIGN PATENT DOCUMENTS

| | | |
|---|---|---|
| GB | 2043382 A | 10/1980 |
| GB | 2360410 A | 9/2001 |
| JP | 5640307 A | 4/1981 |
| JP | 05267963 A | 10/1993 |
| WO | 2008024666 A2 | 2/2008 |
| WO | 2012172544 | 12/2012 |

* cited by examiner

BOOST-ON-DEMAND AMPLIFIER

BACKGROUND

This specification relates generally to audio systems, and, more specifically, to audio systems with amplifiers that use a boost supply to amplify audio signals.

SUMMARY

All examples and features mentioned below can be combined in any technically possible way.

In one aspect, a method for amplifying audio signals includes processing, by a signal processor, an incoming audio sample in preparation for amplification by an electronic amplifier circuit, receiving a voltage from a power supply, determining whether amplification of the incoming audio sample warrants more voltage than the voltage received from the power supply, and before completing the processing of the incoming audio sample, boosting the voltage received from the power supply and supplying the boosted voltage to the electronic amplifier circuit if the incoming audio sample warrants more voltage than the voltage received from the power supply, and otherwise passing the voltage received from the power supply to the electronic amplifier circuit.

Embodiments may include one of the following features, or any combination thereof. The method can include determining whether amplification of the incoming audio sample warrants more voltage than the voltage received from the power supply by adding a level of the incoming audio sample to a volume level of the amplifier and comparing the sum to a threshold value, and boosting the voltage received from the power supply when the sum is greater than or equal to the threshold value. Further, the method can further comprise determining the threshold value based on tuning equalization of a plurality of electronic amplifier circuits configured to receive the boosted voltage.

In addition, the method can include determining that the incoming audio sample does not warrant more voltage than the voltage received from the power supply, and regulating the voltage passed to the electronic amplifier circuit to a predetermined level if the voltage received from power supply drops below the predetermined level. Also, the method can further comprise waiting a minimum period after supplying the boosted voltage to the electronic amplifier circuit before switching back to passing the voltage received from the power supply to the electronic amplifier circuit. In another embodiment, the incoming audio sample is a given one of a group of audio samples, and wherein determining whether amplification of the incoming audio sample warrants more voltage than the voltage received from the power supply includes: determining that the given incoming audio sample has a level greater than or equal to every other audio sample in the group of audio samples; adding the level of the given incoming audio sample to a volume level of the amplifier; comparing the sum to a threshold value; and boosting the voltage received from the power supply when the sum is greater than or equal to the threshold value.

In still another embodiment, the method includes determining that amplification of the incoming audio sample warrants more voltage than the voltage received from the power supply, and in response to the determination, boosting the voltage received from the power supply and supplying the boosted voltage to the electronic amplifier circuit; processing, by the amplifier, a second incoming audio sample in preparation for amplification by the electronic amplifier circuit; determining that the second incoming audio sample does not warrant more voltage than the voltage received from the power supply; and switching back to passing the voltage received from the power supply to the electronic amplifier circuit if a minimum period has lapsed since supplying the boosted voltage to the electronic amplifier circuit, and otherwise continuing to supply the boosted voltage to the electronic amplifier circuit.

In another aspect, the invention features an amplifier comprising an electronic amplifier circuit and a boost supply circuit receiving a voltage from a power supply. The boost supply circuit communicates with the electronic amplifier circuit to provide power thereto. The amplifier further comprises a processor system processing an incoming audio sample to be amplified by the electronic amplifier circuit. The processor system determines whether amplification of the incoming audio sample warrants more voltage than the voltage received from the power supply. Before completing the processing of the incoming audio sample, if the incoming audio sample warrants more voltage than the voltage received from the power supply, the processor system signals the boost supply circuit to boost the voltage received from the power supply and to supply the boosted voltage to the electronic amplifier circuit. Otherwise the processor system signals the boost supply circuit to pass the voltage received from the power supply to the electronic amplifier circuit.

Embodiments of the amplifier may include one of the following features, or any combination thereof. The processor system of the amplifier can determine whether amplification of the incoming audio sample warrants more voltage than the voltage received from the power supply by adding a level in dBFS of the incoming audio sample to a volume level in dBFS of a signal processor, comparing the sum in dBFS to a threshold value, and boosting the voltage received from the power supply when the sum is greater than or equal to the threshold value. The amplifier can further comprise a plurality of electronic amplifier circuits in communication with the boost supply circuit, wherein the processor system of the amplifier determines the threshold value based on tuning equalization of the plurality of electronic amplifier circuits.

In another embodiment, the boost supply circuit of the amplifier regulates the voltage passed to the electronic amplifier circuit to a predetermined level if the boost supply circuit is passing the voltage received from the power supply to the electronic amplifier circuit and the voltage received from power supply drops below the predetermined level.

In other embodiments, the processor system is programmed to wait a minimum period after signaling the boost supply circuit to supply the boosted voltage to the electronic amplifier circuit before signaling the boost supply circuit to switch back to passing the voltage received from the power supply to the electronic amplifier circuit. The processor system can include a signal processor that receives and process a plurality of incoming audio samples to be amplified by the electronic amplifier circuit and is programmed to determine whether amplification of the plurality of incoming audio samples warrants more voltage than the voltage received from the power supply by determining a peak level in dBFS from among the plurality of incoming audio samples, adding the peak level to a volume level in dBFS of the signal processor, comparing the sum in dBFS to a threshold value, and signaling the boost supply circuit to boost the voltage received from the power supply when the sum is greater than or equal to the threshold value.

In still another embodiment, the processor system determines that amplification of the incoming audio sample warrants more voltage than the voltage received from the power supply, and, in response to the determination, signals the boost supply circuit to boost the voltage received from the power supply and to supply the boosted voltage to the electronic amplifier circuit. The processor system processes a second incoming audio sample to be amplified by the electronic amplifier circuit. The processor system being programmed to determine that the second incoming audio sample does not warrant more voltage than the voltage received from the power supply and to signal the boost supply circuit to switch back to passing the voltage received from the power supply to the electronic amplifier circuit if a minimum period has lapsed since signaling the boost supply circuit to supply the boosted voltage to the electronic amplifier circuit. Otherwise, the processor system signals the boost supply circuit to continue supplying the boosted voltage to the electronic amplifier circuit.

In still another aspect, the invention features an automotive vehicle comprising an input source of incoming audio samples, a power supply supplying a voltage, an amplifier in communication with the input source to receive the incoming audio samples therefrom and with the power supply to receive the voltage. The amplifier comprises an electronic amplifier circuit, a boost supply circuit in communication with the electronic amplifier circuit and with the power supply that supplies the voltage, and a processor system processing a given one of the incoming audio samples to be amplified by the electronic amplifier circuit. The processor system determines whether amplification of the given incoming audio sample warrants more voltage than the voltage supplied by the power supply, and, before completing the processing of the given incoming audio sample, signals the boost supply circuit to boost the voltage supplied by the power supply and to supply the boosted voltage to the electronic amplifier circuit if the given incoming audio sample warrants more voltage than the voltage supplied by the power supply. Otherwise, the processor system signals the boost supply circuit to pass the voltage supplied by the power supply to the electronic amplifier circuit.

Embodiments of the amplifier may include one of the following features, or any combination thereof. The processor system of the amplifier can determine whether amplification of the given incoming audio sample warrants more voltage than the voltage supplied by the power supply by adding a level in dBFS of the incoming audio sample to a volume level in dBFS of a signal processor, comparing the sum in dBFS to a threshold value, and boosting the voltage received from the power supply when the sum is greater than or equal to the threshold value. The amplifier can further comprise a plurality of electronic amplifier circuits in communication with the boost supply circuit, wherein the processor system of the amplifier determines the threshold value based on tuning equalization of the plurality of electronic amplifier circuits.

In another embodiment, the boost supply circuit of the amplifier regulates the voltage passed to the electronic amplifier circuit to a predetermined level if the boost supply circuit is passing the voltage received from the power supply to the electronic amplifier circuit and the voltage received from power supply drops below the predetermined level.

In other embodiments, the processor system is programmed to wait a minimum period after signaling the boost supply circuit to supply the boosted voltage to the electronic amplifier circuit before signaling the boost supply circuit to switch back to passing the voltage received from the power supply to the electronic amplifier circuit. The processor system can include a signal processor that receives and process a plurality of incoming audio samples to be amplified by the electronic amplifier circuit. The processor system is programmed to determine whether amplification of the plurality of incoming audio samples warrants more voltage than the voltage received from the power supply by determining a peak level in dBFS from among the plurality of incoming audio samples, adding the peak level to a volume level in dBFS of the signal processor, comparing the sum in dBFS to a threshold value, and signaling the boost supply circuit to boost the voltage received from the power supply when the sum is greater than or equal to the threshold value.

In still another embodiment, the processor system determines that amplification of the incoming audio sample warrants more voltage than the voltage received from the power supply, and, in response to the determination, signals the boost supply circuit to boost the voltage received from the power supply and to supply the boosted voltage to the electronic amplifier circuit. The processor system processes a second incoming audio sample to be amplified by the electronic amplifier circuit. The processor system being programmed to determine that the second incoming audio sample does not warrant more voltage than the voltage received from the power supply and to signal the boost supply circuit to switch back to passing the voltage received from the power supply to the electronic amplifier circuit if a minimum period has lapsed since signaling the boost supply circuit to supply the boosted voltage to the electronic amplifier circuit. Otherwise, the processor system signals the boost supply circuit to continue supplying the boosted voltage to the electronic amplifier circuit.

BRIEF DESCRIPTION OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 1:
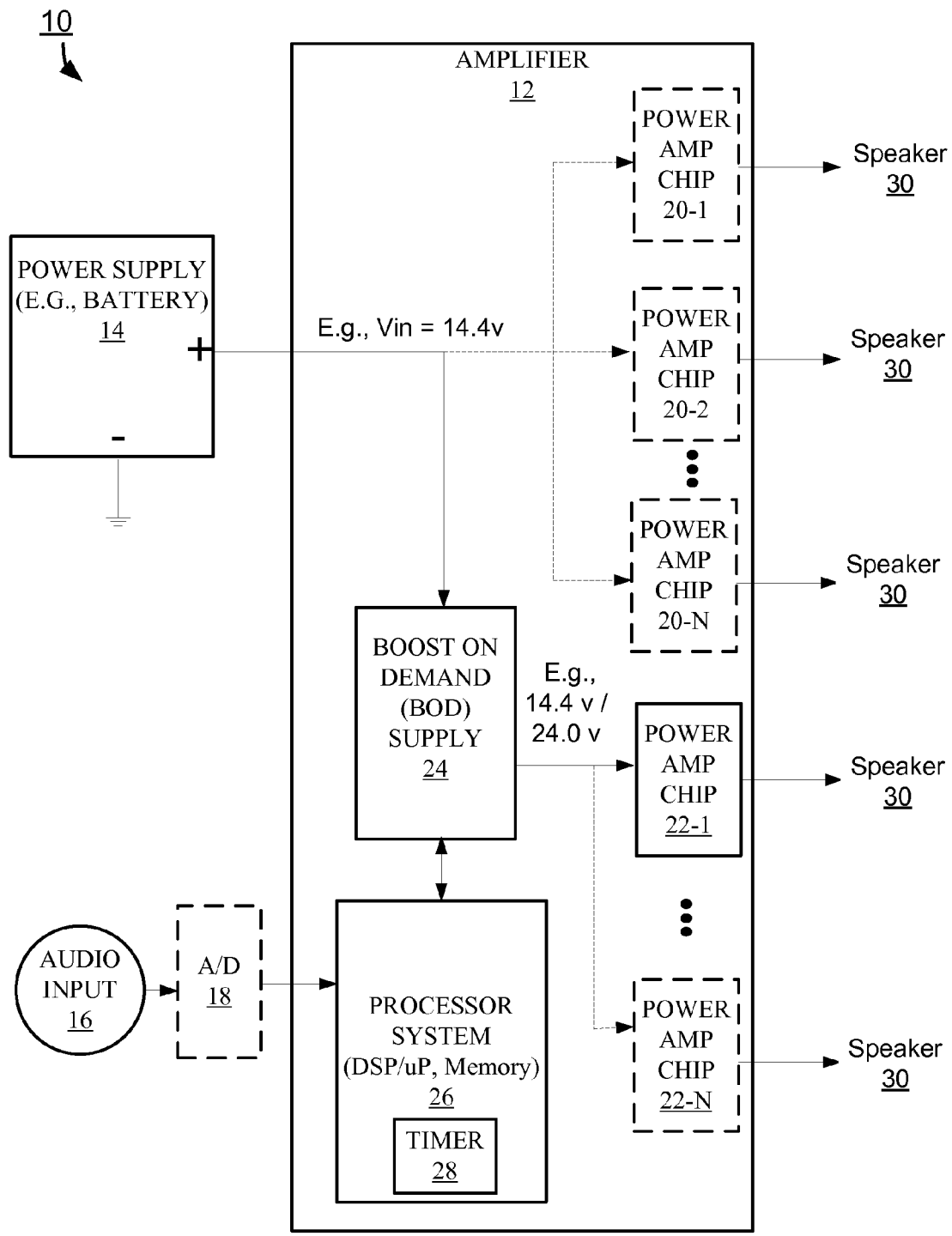
FIG. 1 is a block diagram of an embodiment of a boost-on-demand system including an amplifier in communication with a power supply, an input source, and a plurality of speakers.

Boost-on-demand (BOD) systems described herein include an amplifier configured to reduce power drawn from a power supply, such as a battery or a car alternator, by using a boost supply that shuts off when the output power is low enough not to require boosting, and turns on automatically when the output power requires the extra power. In brief overview, these boost-on-demand systems can decide whether to boost power or to pass through battery power based on the size of the incoming audio signals and the level of the volume control of the amplifier. The BOD system adds the size of the incoming audio sample (in dB Full Scale or dBFS) to the volume setting (in dBFS) of the amplifier, and compares the sum to a threshold. If the sum exceeds the threshold, the BOD system turns on the boost supply; otherwise, the BOD system passes the battery voltage to the one or more power amplifiers. The threshold is predetermined, based on a tuning equalization of the boosted channels. Each BOD system establishes its own threshold.

In addition, the amplifier has a digital signal processor for processing the audio incoming samples. This audio processing, from incoming audio samples to outgoing audio, incurs a delay. In some amplifiers, this delay can be as long as 50 ms. This latency incurred by the digital signal processing provides a window of time within which a decision to boost may be made, and within which the voltage can ramp from the battery voltage to the boost voltage. Consider, for example, that the voltage supplied to the power amplifier takes 5 ms to rise from a battery voltage of 14.4 volts to a boost voltage of 24 volts. For an amplifier that incurs a 50 ms processing delay, the boost voltage has an additional 45 ms to settle before a power amplifier converts the audio sample that triggered the boost into audio. Thus, the BOD system capitalizes on the delay to "predict" whether a given incoming audio sample (or group of samples) requires boosting, and to ensure the boost voltage is delivered and stable before the audio processing of that sample(s) is completed. Other amplifiers may incur shorter or longer delays than 50 ms, and other BOD systems may have shorter and longer voltage rise times; the salient criteria is that the processing delay be sufficiently long for the BOD system to render the boost decision for an audio sample, and then for the voltage to rise to the boost voltage to power amplification of that audio sample. After an incoming audio sample triggers the boost supply to turn on, a built-in timer keeps the boost supply on for a minimum duration (e.g., 160 ms), to avoid hysteresis that may result from switching the boost supply 24 on and off too frequently.

Advantageously, the BOD system can also be configured to operate as a holdup supply when the battery voltage drops below a specified level. Typically, when the BOD system determines not to boost, it operates to pass the battery voltage through to the one or more power amplifiers. If the battery voltage is below this specified level, the boost supply holds the voltage at that specified level.

FIG. 1 shows an embodiment of a boost-on-demand (BOD) system 10 that can operate within, for example, a vehicle. The BOD system 10 includes an amplifier 12 in communication with a power supply 14 and with an input source 16 of audio signals. The power supply 14 (typically, a battery or an alternator of the automotive vehicle) provides a particular voltage (e.g., 14.4 volts), also referred to as a battery voltage. The positive terminal (+) of the power supply 14 connects to amplifier 12; the negative terminal (−), to the system ground (e.g., the chassis of the vehicle). The input source 16 can be, for example, an RF (radio frequency) receiver that provides analog audio signals. An analog-to-digital (A/D) signal converter 18 can convert such signals from the input source into digital audio samples, and provide the digital signals to the amplifier 12. Although shown separate from the amplifier 12, the A/D converter 18 can be part of the amplifier 12. Alternatively, the input source 16 can be a digital audio source, for example, a CD player, that passes digital audio samples directly to the amplifier 12.

The amplifier 12 includes a plurality of power amplifier chips 20-1, 20-2, 20-N, 22-1, 22-N (also referred to as electronic amplifier circuits), a BOD supply 24, a processor system 26. The processor system 26 includes a timer 28. In one embodiment, each of the power amplifier chips 20, 22 is a class-D amplifier (i.e., switching amplifier). Each power amplifier chip 20-1, 20-2, 20-N, 22-1, 22-N is in communication with at least one speaker 30, and corresponds to a separate channel. Each speaker 30 may be selected for the particular frequencies of the channel for which that speaker is used. The power supply 14 is in electrical communication with each power amplifier chip 20-1, 20-2, 20-N (generally, 20) and with the BOD supply 24.

The BOD supply 24 is in electrical communication with the one or more power amplifier chips 22-1, 22-N (generally, 22). Each of these power amplifier chips 22 corresponds to a boosted output or channel. The BOD supply 24 is configured to pass through the battery voltage (e.g., 14.4 V) or to supply a boosted voltage (e.g., 24 V) to the one or more power amplifier chips 22, as later described in more detail.

The different reference numerals (20, 22) given to the power amplifier chips are herein used to distinguish between those power amplifier chips 22 that are configured to receive a boosted voltage from the BOD supply 24, and those power amplifier chips 20 that are not. In addition, although FIG. 1 shows a plurality of power amplifier chips 20-1, 20-2, 20-N, other embodiments can have zero or only one power amplifier chip 20 in electrical communication with the power supply 14.

The processor system 26 includes the computing resources of the amplifier 12. In one embodiment, the processor system 26 includes a digital signal processor, a microprocessor (or microcontroller), and memory. The digital signal processor processes the digital audios samples arriving from the A/D converter 18 (or, directly from the input source 16 if the input source is a digital audio source), and the microprocessor performs the switching of the B OD supply 24 on and off in accordance with program code stored in the memory. In other embodiments, the functionality of the DSP and the microprocessor can be combined in a single processor. The timer 28, which can be part of the DSP, is set to a value corresponding to the minimum duration for which the BOD supply 24 stays turned on; that is, to avoid turning the BOD supply 24 off too soon after being turned on, thereby potentially producing unwanted hysteresis. This minimum duration can also serve to give the microprocessor sufficient time to complete various monitoring functions. In one embodiment, this timer is set to 160 ms.

Figure 2:
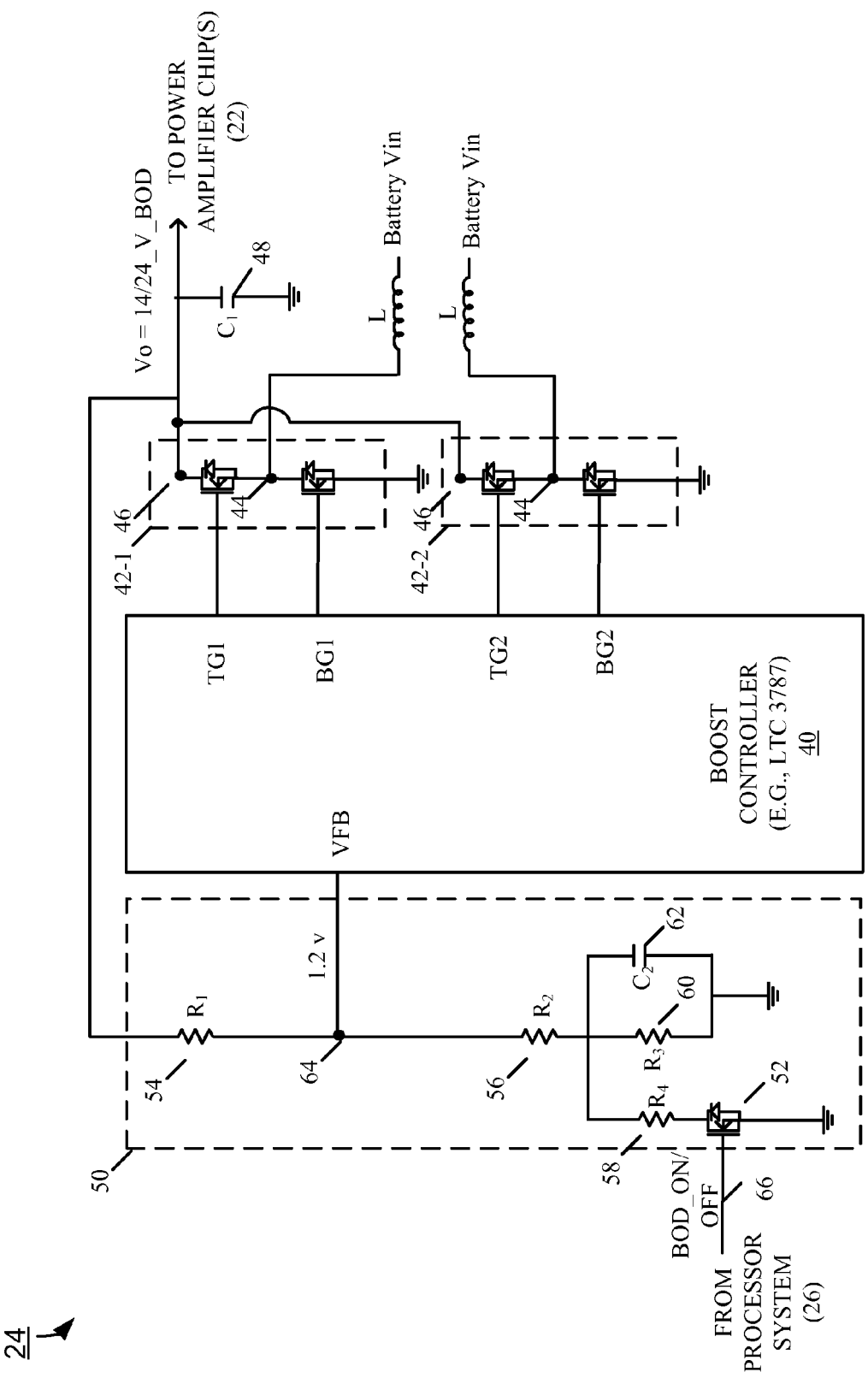
FIG. 2 is a simplified circuit diagram of an embodiment of a boost-on-demand supply circuit.

FIG. 2 shows an embodiment of the BOD supply 24 including a boost controller chip 40 for producing the boost voltage and supplying the boosted voltage to the power amplifier chips 22 on demand. In this embodiment, the boost controller chip 40 is implemented with an LTC3787 Polyphase Synchronous Boost Controller device, produced by Linear Technology Corporation of Milpitas, Calif. Other boost controller chips can be used without departing from the principles described herein. The pins of the boost controller chip 40 include a TG1 (Top Gate 1) pin, a BG1 (Bottom Gate 1), a TG2 (Top Gate2) pin, a BG2 (Bottom Gate 2) pin, and a VFB (Regulated Feedback Voltage) pin. For simplicity sake, not every pin of the boost controller chip 40 is shown or described.

The TG1 and BG1 pins are connected to the top and bottom gates, respectively, of a first pair 40-1 of synchronous N-channel MOSFETs; the TG2 and BG2 pins are connected to the top and bottom gates, respectively, of a second pair 40-2 of synchronous N-channel MOSFETs. The center node 44 between the top and bottom gates of each synchronous N-channel MOSFET pair 40-1, 40-2 is connected to the battery voltage (Vin) through an inductor (L). The source node 46 of the top gate of each synchronous N-channel MOSFET pair 40-1, 40-2 is connected to the output (Vo) of the BOD supply 24. A capacitor ($C_1$) 48 is connected to the output (Vo). Preferably, the size of the capacitor ($C_1$) 48 is less than or equal to 5000 µF. This output (Vo) is fed back to the VFB pin of the boost controller chip 40. In accordance with the operation of BOD supply 24, the output (Vo) is a regulated DC voltage that switches between the battery voltage (Vin, e.g., 11V) and the boost voltage (e.g., 24.0 V). In some instances, the output (Vo) can be held at a hold-up voltage, as described later in more detail.

A resistive divider circuit 50, connected to the output (Vo) and to the VFB pin of the boost controller chip 40, controls the switching between the battery voltage (Vin) and the boost voltage. The circuit 50 includes a MOSFET 52, a first resistor ($R_1$) 54, a second resistor ($R_2$) 56, a third resistor ($R_3$) 58, a fourth resistor ($R_4$) 60, and a capacitor ($C_2$) 62. The first resistor ($R_1$) 54 and second resistor ($R_2$) 56 are connected in series. The node 64 between the first resistor ($R_1$) 54 and second resistor ($R_2$) 56 is connected to the VFB pin. The third resistor ($R_3$) 58, fourth resistor ($R_4$) 60, and a capacitor ($C_2$) 62 are connected in parallel. The fourth resistor ($R_4$) 60 is also connected to the source of the MOSFET 52.

Connected to the gate of the MOSFET 52 is the processor system 26, which sends high and low signals over a BOD_ON/OFF signal line 66, to turn the MOSFET 52 on and off, respectively. The circuit 50 provides a voltage divider; the resulting voltage at node 64 depends on the on/off state of the MOSFET 52. When the MOSFET 52 is turned on, by a high signal arriving at its gate over the BOD_ON/OFF signal line 66, the resistance of the fourth resistor ($R_4$) 60 factors into the resulting voltage on the node 64. When the MOSFET 52 is turned off, by a low signal arriving at its gate over the BOD_ON/OFF signal line 66, the resistance of the fourth resistor ($R_4$) 60 is effectively removed from the voltage divider operation.

The values of the various components of the circuit 50 are selected to provide a boost voltage (e.g., approximately 24 volts) when the MOSFET 52 is on and to pass through the battery voltage when the MOSFET 52 is off. The circuit 50 also produces a hold-up voltage (e.g., approximately 10 volts) in the event the battery voltage drops below a certain level. This hold-up voltage is less than the input voltage expected to be supplied by the battery. Normally, when the input voltage (Vin) is greater than the output voltage (Vo), such as when the boost controller 40 is not boosting, the boost controller 40 passes the input voltage (Vin) through to the output. Accordingly, if the battery voltage (Vin) is greater than the hold-up voltage, as it typically is, the battery voltage is passed to the output. If the battery voltage, however, drops below this hold-up voltage, the boost controller 40 regulates the output (Vo) to the hold-up voltage. If the MOSFET 52 is turned on, and the boost controller 40 is boosting the voltage, the output (Vo) is regulated to the boost voltage irrespective of whether the input voltage (Vin) is above or below the hold-up voltage.

The values of the various components of the circuit 50 are also selected to produce a particular rise rate of the output voltage (Vo) when switching from the battery voltage to the boost voltage. For the boost voltage to be available at the power amplifier 22 in time to amplify a given incoming audio sample, the voltage needs to ramp from the battery voltage to the boost voltage before the processor system 26 completes processing the incoming audio sample. Preferably, the voltage can ramp from the battery voltage to the boost voltage within 20 ms, leaving approximately 30 ms for the voltage to settle at the boost voltage level. In one embodiment that achieves these objectives, the value of the first resistor ($R_1$) 54 is 90.9K, the value of the second resistor ($R_2$) 56 is 2.49K, the value of the third resistor ($R_3$) 58 is 9.09K, the value of the fourth resistor ($R_4$) 60 is 3.32K, and the value of the capacitor ($C_2$) 62 is 2.2 µF. This particular combination of component values produces a hold-up voltage of approximately 10 v at the output (Vo). If the voltage supplied by power supply (Vin) is less than the hold-up voltage, the BOD supply 24 boosts the voltage supplied by power supply to produce the hold-up voltage at the output (Vo). Other combinations of component values can be used to achieve the above-noted objectives of target boost and hold-up voltage levels and ramp rate.

Figure 3:
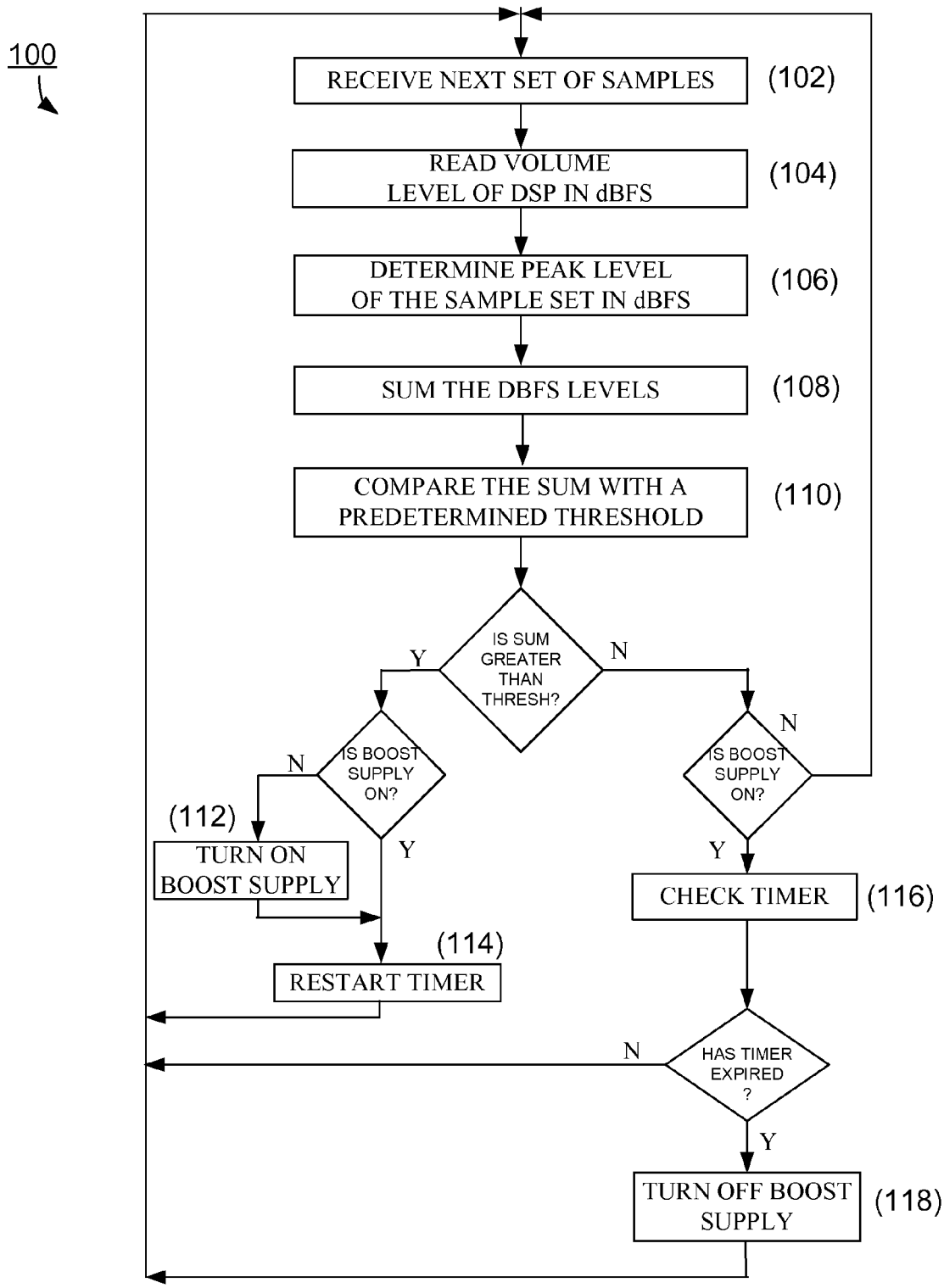
FIG. 3 is a flow diagram of an embodiment of a process for amplifying audio signals.

FIG. 3 shows an embodiment of a process 100 for switching on the boost supply 24 to boost one or more output channels (i.e., power amplifier chips 22) and off when boosting is deemed unwarranted. (It is to be understood that the boosting operation is what is turned on and off; the BOD supply 24 itself, more specifically, the boost controller 40, remains running (i.e., on) throughout the switching of the boost function on and off). In the description of this process 100, reference is made also to the elements of FIG. 1 and FIG. 2. The process 100 can operate on every incoming sample from the input source 16 or upon a group of incoming audio samples. For purposes of illustration, the following description of the process 100 is in connection with a group (or set) of incoming audio samples.

At step 102, the processor system 26 acquires a set of audio samples from the A/D converter 18. Before or while processing the set of audio samples, the processor system 26 reads (step 104) the volume level (in dBFS) of the DSP. The processor system 26 also determines (step 106) the peak level (in dBFS) in the set of incoming audio samples. The processor system 26 then sums (step 108) the two dBFS levels, and compares (step 110) the sum with a predetermined threshold (in dBFS). (An example of a process for predetermining this threshold is described in connection with FIG. 4). In one embodiment, the threshold is 104 dBFS. Until this threshold is reached, the BOD supply 24 passes the battery voltage from the power supply 14 through to the one or more power amplifier chips 22.

If the sum exceeds the threshold, the processor system 26 has determined that the one or more power amplifier chips 22 require a power boost for this particular audio sample. In response, if the boost supply is not presently on, the processor system 26 issues a high BOD_ON/OFF signal 66 that turns on (step 112) the boost supply. (In one embodiment, as shown previously in FIG. 2, a high BOD_ON/OFF signal 66 turns on the MOSFET switch 52, causing the boost controller 40 to switch to the boost voltage, and a low BOD_ON/OFF signal turns off the MOSFET switch 52, causing the boost controller 40 to pass through the battery voltage.)

If presently off when the high BOD_ON/OFF signal 66 is received, the BOD supply 24 responds by switching to provide the boost voltage (e.g., a regulated 24 V) to the one or more power amplifiers 22. If already on when the BOD_ON/OFF signal is received, the boost supply 24 continues to provide the boost voltage to the power amplifiers 22. The processor system 26 also resets and restarts (step 114) the timer 28 from time 0 ($t_0$). Accordingly, the timer 28 provides a sliding window that resets with each set of samples requiring the boost voltage.

If the result of the comparison indicates that the sum is less than the threshold, and the BOD supply 24 is presently off, the processor system 26 continues to issue a low BOD_ON/OFF signal 66 that keeps the BOD supply 24 turned off and acquires (step 102) the next set of audio samples for processing. Accordingly, the BOD supply 24 responds to the low BOD_ON/OFF signal 66 passing the voltage of the power supply 14 through to the one or more power amplifier chips 22. If, instead, the BOD supply 24 is presently on, the processor system 26 checks (step 116) the timer 28. If the timer 28 has expired, the processor system 26 issues a low BOD_ON/OFF signal 66 that turns off (step 118) the BOD supply 24. If the processor system 26 otherwise determines that the timer 28 has not expired, the process 100 returns to processing the next set of audio samples). Although this present set of audio samples does not need an output boost, the BOD supply 24 has too recently turned on for it now to be switched off.

Figure 4:
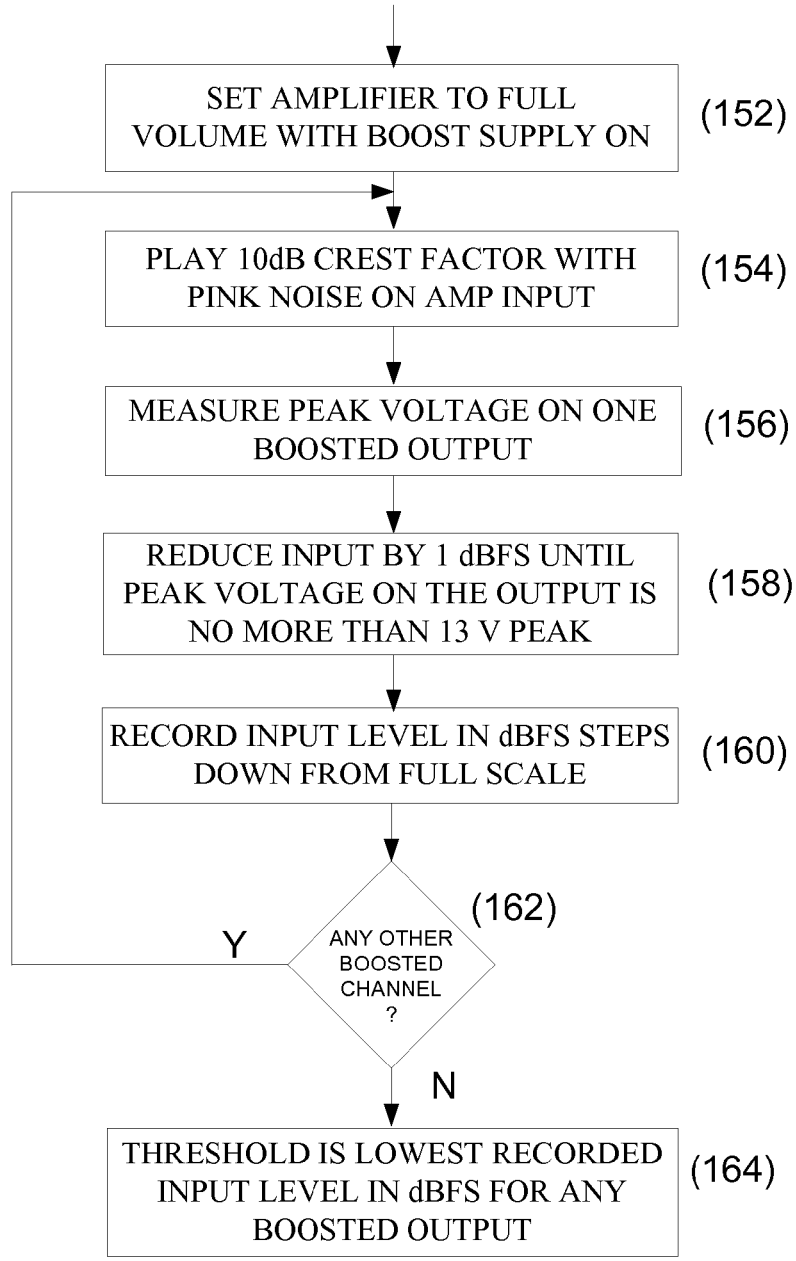
FIG. 4 is a flow diagram of an embodiment of a process for determining a threshold used as a trigger to supply a boosted voltage to one or more power amplifiers of the amplifier.

FIG. 4 shows an embodiment of a process 150 for determining the boost threshold for the boost-on-demand system 10. At step 152, the amplifier 12 is set to full volume, with the BOD supply 24 turned on. A 10 dB crest factor pink noise signal, with peak level reaching 0 dBFS, is played (step 154) on the input of the amplifier 12. Peak level is measured (step 156) on one boosted output (i.e., channel). The input signal is reduced (step 158), in one decibel increments, until the peak level on the boosted output no longer exceeds 13 volts peak (here, 13 volts is an example). Other finer or coarser increments than one decibel and higher or lower threshold voltages than 13 volts can be used without departing from the principles described herein. In response to the peak level on the boosted output no longer exceeding 13 volts, the level of the input signal is recorded (step 160), in the number of decibel steps, down from full scale. The process 150 repeats for each boosted output. The threshold to be used by the boost-on-demand system 10 for switching the BOD supply 24 on and off is the lowest input level recorded in step 160 for the boosted outputs.

Embodiments of the systems and methods described above comprise computer components and computer-implemented steps that will be apparent to those skilled in the art. For example, it should be understood by one of skill in the art that the computer-implemented steps may be stored as computer-executable instructions on a computer-readable medium such as, for example, floppy disks, hard disks, optical disks, Flash ROMS, nonvolatile ROM, and RAM. Furthermore, it should be understood by one of skill in the art that the computer-executable instructions may be executed on a variety of processors such as, for example, microprocessors, digital signal processors, gate arrays, etc. For ease of exposition, not every step or element of the systems and methods described above is described herein as part of a computer system, but those skilled in the art will recognize that each step or element may have a corresponding computer system or software component. Such computer system and/or software components are therefore enabled by describing their corresponding steps or elements (that is, their functionality), and are within the scope of the disclosure.

A number of implementations have been described. Nevertheless, it will be understood that additional modifications may be made without departing from the scope of the inventive concepts described herein, and, accordingly, other embodiments are within the scope of the following claims.

What is claimed is:

1. A method for amplifying audio signals, the method comprising:
    processing, by a signal processor, an incoming audio sample in preparation for amplification by an electronic amplifier circuit;
    receiving a voltage from a power supply;
    determining whether amplification of the incoming audio sample warrants more voltage than the voltage received from the power supply;
    before completing the processing of the incoming audio sample, boosting the voltage received from the power supply and supplying the boosted voltage to the electronic amplifier circuit if the incoming audio sample warrants more voltage than the voltage received from the power supply, and otherwise passing the voltage received from the power supply to the electronic amplifier circuit; and
    waiting a minimum period after supplying the boosted voltage to the electronic amplifier circuit before switching back to passing the voltage received from the power supply to the electronic amplifier circuit.

2. The method of claim 1, wherein determining whether amplification of the incoming audio sample warrants more voltage than the voltage received from the power supply includes:
    adding a level of the incoming audio sample to a volume level of the amplifier and comparing the sum to a threshold value; and
    boosting the voltage received from the power supply when the sum is greater than or equal to the threshold value.

3. The method of claim 2, further comprising determining the threshold value based on tuning equalization of a plurality of electronic amplifier circuits configured to receive the boosted voltage.

4. The method of claim 1, further comprising:
    determining that the incoming audio sample does not warrant more voltage than the voltage received from the power supply; and
    regulating the voltage passed to the electronic amplifier circuit to a predetermined level if the voltage received from power supply drops below the predetermined level.

5. The method of claim 1, wherein the incoming audio sample is a given one of a group of audio samples, and wherein determining whether amplification of the incoming audio sample warrants more voltage than the voltage received from the power supply includes:
    determining that the given incoming audio sample has a level greater than or equal to every other audio sample in the group of audio samples;
    adding the level of the given incoming audio sample to a volume level of the amplifier;
    comparing the sum to a threshold value; and
    boosting the voltage received from the power supply when the sum is greater than or equal to the threshold value.

6. The method of claim 1, further comprising:
    determining that amplification of the incoming audio sample warrants more voltage than the voltage received from the power supply, and in response to the determination, boosting the voltage received from the power supply and supplying the boosted voltage to the electronic amplifier circuit;
    processing, by the amplifier, a second incoming audio sample in preparation for amplification by the electronic amplifier circuit;
    determining that the second incoming audio sample does not warrant more voltage than the voltage received from the power supply; and
    switching back to passing the voltage received from the power supply to the electronic amplifier circuit if the minimum period has lapsed since supplying the boosted voltage to the electronic amplifier circuit, and otherwise continuing to supply the boosted voltage to the electronic amplifier circuit.

7. An amplifier comprising:
    an electronic amplifier circuit;
    a boost supply circuit receiving a voltage from a power supply, the boost supply circuit communicating with the electronic amplifier circuit to provide power thereto; and
    a processor system processing an incoming audio sample to be amplified by the electronic amplifier circuit, the processor system determining whether amplification of the incoming audio sample warrants more voltage than the voltage received from the power supply, and, before completing the processing of the incoming audio sample, signaling the boost supply circuit to boost the voltage received from the power supply and to supply the boosted voltage to the electronic amplifier circuit if the incoming audio sample warrants more voltage than the voltage received from the power supply, and otherwise signaling the boost supply circuit to pass the voltage received from the power supply to the electronic amplifier circuit, the processor system being programmed to wait a minimum period after signaling the boost supply circuit to supply the boosted voltage to the electronic amplifier circuit before signaling the boost supply circuit to switch back to passing the voltage received from the power supply to the electronic amplifier circuit.

8. The amplifier of claim 7, wherein the processor system includes a signal processor, and the processor system determines whether amplification of the incoming audio sample warrants more voltage than the voltage received from the power supply by:
  adding a level in dBFS of the incoming audio sample to a volume level in dBFS of the signal processor;
  comparing the sum in dBFS to a threshold value; and
  boosting the voltage received from the power supply when the sum is greater than or equal to the threshold value.

9. The amplifier of claim 8, further comprising a plurality of electronic amplifier circuits in communication with the boost supply circuit, and wherein the processor system determines the threshold value based on tuning equalization of the plurality of electronic amplifier circuits.

10. The amplifier of claim 7, wherein the boost supply circuit regulates the voltage passed to the electronic amplifier circuit to a predetermined level if the boost supply circuit is passing the voltage received from the power supply to the electronic amplifier circuit and the voltage received from power supply drops below the predetermined level.

11. The amplifier of claim 7, wherein the processor system includes a signal processor, the signal processor receiving and processing a plurality of incoming audio samples to be amplified by the electronic amplifier circuit, the processor system being programmed to determine whether amplification of the plurality of incoming audio samples warrants more voltage than the voltage received from the power supply by:
  determining a peak level in dBFS from among the plurality of incoming audio samples;
  adding the peak level to a volume level in dBFS of the signal processor;
  comparing the sum in dBFS to a threshold value; and
  signaling the boost supply circuit to boost the voltage received from the power supply when the sum is greater than or equal to the threshold value.

12. The amplifier of claim 7, wherein the processor system determines that amplification of the incoming audio sample warrants more voltage than the voltage received from the power supply, and, in response to the determination, signals the boost supply circuit to boost the voltage received from the power supply and to supply the boosted voltage to the electronic amplifier circuit, the processor system processing a second incoming audio sample to be amplified by the electronic amplifier circuit, the processor system being programmed to determine that the second incoming audio sample does not warrant more voltage than the voltage received from the power supply, and to signal the boost supply circuit to switch back to passing the voltage received from the power supply to the electronic amplifier circuit if the minimum period has lapsed since signaling the boost supply circuit to supply the boosted voltage to the electronic amplifier circuit, and otherwise signaling the boost supply circuit to continue supplying the boosted voltage to the electronic amplifier circuit.

13. An automotive vehicle, comprising:
  an input source of incoming audio samples;
  a power supply supplying a voltage;
  an amplifier in communication with the input source to receive the incoming audio samples therefrom and with the power supply to receive the voltage, the amplifier comprising:
    an electronic amplifier circuit;
    a boost supply circuit in communication with the electronic amplifier circuit and with the power supply that supplies the voltage; and
    a processor system processing a given one of the incoming audio samples to be amplified by the electronic amplifier circuit, the processor system determining whether amplification of the given incoming audio sample warrants more voltage than the voltage supplied by the power supply, and, before completing the processing of the given incoming audio sample, signaling the boost supply circuit to boost the voltage supplied by the power supply and to supply the boosted voltage to the electronic amplifier circuit if the given incoming audio sample warrants more voltage than the voltage supplied by the power supply, and otherwise to pass the voltage supplied by the power supply to the electronic amplifier circuit, the processor system being programmed to wait a minimum period after signaling the boost supply circuit to supply the boosted voltage to the electronic amplifier circuit before signaling the boost supply circuit to switch back to passing the voltage supplied by the power supply to the electronic amplifier circuit.

14. The automotive vehicle of claim 13, wherein the processor system of the amplifier includes a signal processor that receives and processes the given incoming audio sample to be amplified by the electronic amplifier circuit, the processor system determining whether amplification of the given incoming audio sample warrants more voltage than the voltage supplied by the power supply by:
  adding a level in dBFS of the incoming audio sample to a volume level in dBFS of the signal processor;
  comparing the sum in dBFS to a threshold value; and
  boosting the voltage received from the power supply when the sum is greater than or equal to the threshold value.

15. The automotive vehicle of claim 14, wherein the amplifier further comprises a plurality of electronic amplifier circuits in communication with the boost supply circuit, and wherein the processor system of the amplifier determines the threshold value based on a tuning equalization of the plurality of electronic amplifier circuits.

16. The automotive vehicle of claim 13, wherein the boost supply circuit of the amplifier regulates the voltage passed to the electronic amplifier circuit to a predetermined level if the boost supply circuit is passing the voltage supplied by the power supply to the electronic amplifier circuit and the voltage supplied by power supply is below the predetermined level.

17. The automotive vehicle of claim 13, wherein the processor system of the amplifier includes a signal processor that receives and processes a group of the incoming audio samples to be amplified by the electronic amplifier circuit, the processor system being programmed to determine whether amplification of the group of the incoming audio samples warrants more voltage than the voltage supplied by the power supply by:

determining a peak level in dBFS from among the group of the incoming audio samples;

adding the peak level to a volume level in dBFS of the signal processor;

comparing the sum in dBFS to a threshold value; and signaling the boost supply circuit to boost the voltage supplied by the power supply when the sum is greater than or equal to the threshold value.

18. The automotive vehicle of claim 13, wherein the processor system of the amplifier determines that amplification of the given incoming audio sample warrants more voltage than the voltage supplied by the power supply, and, in response to the determination, signals the boost supply circuit of the amplifier to boost the voltage supplied by the power supply and to supply the boosted voltage to the electronic amplifier circuit, the processor system of the amplifier further processing a second given incoming audio sample to be amplified by the electronic amplifier circuit, the processor system being programmed to determine that the second given incoming audio sample does not warrant more voltage than the voltage supplied by the power supply, and to signal the boost supply circuit to switch back to passing the voltage supplied by the power supply to the electronic amplifier circuit if the minimum period has lapsed since signaling the boost supply circuit to supply the boosted voltage to the electronic amplifier circuit, and otherwise signaling the boost supply circuit to continue supplying the boosted voltage to the electronic amplifier circuit.

19. A method for amplifying audio signals, the method comprising:

processing, by a signal processor, an incoming audio sample in preparation for amplification by an electronic amplifier circuit;

receiving a voltage from a power supply;

determining a threshold value based on tuning equalization of a plurality of electronic amplifier circuits configured to receive a boosted voltage;

adding a level of the incoming audio sample to a volume level of the amplifier and comparing the sum to the threshold value; and before completing the processing of the incoming audio sample, boosting the voltage received from the power supply and supplying the boosted voltage to the electronic amplifier circuit if the sum is greater than or equal to the threshold value, and otherwise passing the voltage received from the power supply to the electronic amplifier circuit.

20. The method of claim 19, further comprising waiting a minimum period after supplying the boosted voltage to the electronic amplifier circuit before switching back to passing the voltage received from the power supply to the electronic amplifier circuit.

21. A method for amplifying audio signals, the method comprising:

processing, by a signal processor, an incoming audio sample in preparation for amplification by an electronic amplifier circuit;

receiving a voltage from a power supply;

determining whether amplification of the incoming audio sample warrants more voltage than the voltage received from the power supply;

before completing the processing of the incoming audio sample, boosting the voltage received from the power supply and supplying the boosted voltage to the electronic amplifier circuit if the incoming audio sample warrants more voltage than the voltage received from the power supply, and otherwise passing the voltage received from the power supply to the electronic amplifier circuit;

determining that amplification of the incoming audio sample does not warrant more voltage than the voltage received from the power supply; and regulating the voltage passed to the electronic amplifier circuit to a predetermined level if the voltage received from power supply drops below the predetermined level.

* * * * *